(12) United States Patent
Woodruff et al.

(10) Patent No.: US 6,484,578 B2
(45) Date of Patent: *Nov. 26, 2002

(54) VIBRATING BEAM ACCELEROMETER

(75) Inventors: James R. Woodruff, Redmond, WA (US); Steven A. Foote, Issaquah, WA (US)

(73) Assignee: AlliedSignal Inc., Morristown, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/398,719

(22) Filed: Sep. 20, 1999

(65) Prior Publication Data

US 2001/0047688 A1 Dec. 6, 2001

Related U.S. Application Data

(63) Continuation-in-part of application No. 09/281,755, filed on Mar. 30, 1999, now Pat. No. 6,119,520, which is a division of application No. 08/735,299, filed on Oct. 22, 1996, now Pat. No. 5,948,981, which is a continuation-in-part of application No. 08/651,927, filed on May 21, 1996.
(60) Provisional application No. 60/044,034, filed on Apr. 22, 1997.

(51) Int. Cl.$^7$ .............................................. G01P 15/08
(52) U.S. Cl. .................................................... 73/514.29
(58) Field of Search ........................ 73/514.29, 862.59, 73/514.16, DIG. 1

(56) References Cited

U.S. PATENT DOCUMENTS

| | | | | |
|---|---|---|---|---|
| 5,090,254 A | * | 2/1992 | Guckel et al. | ........... 73/514.29 |
| 5,948,981 A | * | 9/1999 | Woodruff | ................. 73/514.29 |
| 6,128,956 A | * | 10/2000 | Foote | ..................... 73/514.29 |

* cited by examiner

*Primary Examiner*—John E. Chapman

(57) ABSTRACT

A pendulous accelerometer wherein the active reaction mass is pendulously mounted external to a fixed support structure and may include sensor cover of covers in the total active reaction mass.

5 Claims, 10 Drawing Sheets

VIBRATING BEAM ACCELEROMETER

CROSS-REFERENCE TO RELATED APPLICATIONS

This application is a continuation-in-part of U.S. patent application Ser. No. 09/281,755 filed Mar. 30, 1999, now U.S. Pat. No. 6,119,520, which is a division of U.S. patent application Ser. No. 08/735,299 filed Oct. 22, 1996, now U.S. Pat. No. 5,948,981, which is a continuation-in-part of U.S. application Ser. No. 08/651,927 filed May 21, 1996, each of which is incorporated herein by reference. This application also claims benefit of the priority filing date of U.S. patent application Ser. No. 08/943,719, filed Oct. 3, 1997, now U.S. Pat. No. 6,041,655, which claims priority from U.S. provisional application Ser. No. 60/044,034 filed Apr. 22, 1997, each of which are incorporated herein by reference.

BACKGROUND OF THE INVENTION

The present invention relates generally to the detection and measurement of forces and more particularly to an improved accelerometer incorporating one or more vibrating force transducers for measuring the force applied to a proof mass. The present invention also relates to a method for manufacturing the accelerometer.

A widely used technique for force detection and measurement employs a mechanical resonator having a frequency of vibration proportional to the force applied. In one such mechanical resonator, one or more elongate beams are coupled between an instrument frame and a proof mass suspended by a flexure. A force, which may be electrostatic, electromagnetic or piezoelectric, is applied to the beams to cause them to vibrate transversely at a resonant frequency. The mechanical resonator is designed so that force applied to the proof mass along a fixed axis will cause tension or compression of the beams, which varies the frequency of the vibrating beams. The force applied to the proof mass is quantified by measuring the change in vibration frequency of the beams.

Recently, vibratory force transducers have been fabricated from a body of semiconductor material, such as silicon, by micromachining techniques. For example, one micromachining technique involves masking a body of silicon in a desired pattern, and then deep etching the silicon to remove unmasked portions thereof. The resulting three-dimensional silicon structure functions as a miniature mechanical resonator device, such as an accelerometer that includes a proof mass suspended by a flexure. Existing techniques for manufacturing these miniature devices are described in U.S. Pat. Nos. 5,006,487, "Method of Making an Electrostatic Silicon Accelerometer" and 4,945,765 "Silicon Micromachined Accelerometer", the complete disclosures of which are incorporated herein by reference.

The present invention is particularly concerned with Accelerometers having vibrating beams driven by electrostatic forces. In one method of fabricating such miniature accelerometers, a thin layer of silicon, on the order of about 20 micrometers thick, is epitaxially grown on a planar surface of a silicon substrate. The epitaxial layer is etched, preferably by reactive ion etching in a suitable plasma, to form the vibrating components of one or more vibratory force transducers (i.e., vibrating beams and electrodes). The opposite surface of the substrate is etched to form a proof mass suspended from a stationary frame by one or more flexure hinge(s). While the opposite surface of the substrate is being etched, the epitaxial layer is typically held at an electric potential to prevent undesirable etching of the epitaxial layer. During operation of the transducer, the beams and the electrodes are electrically isolated from the substrate by back biasing a diode junction between the epitaxial layer and the substrate. The transducer may then be coupled to a suitable electrical circuit to provide the electrical signals required for operation. In silicon vibrating beam accelerometers, for example, the beams are capacitively coupled to the electrodes, and then both the beams and electrodes are connected to an oscillator circuit.

The above described method of manufacturing force detection devices suffers from a number of drawbacks. One such drawback is that the beams and electrodes of the vibratory force transducer(s) are often not sufficiently electrically isolated from the underlying substrate. At high operating temperatures, for example, electric charge or current may leak across the diode junction between the substrate and the epitaxial layer, thereby degrading the performance of the transducer(s). Another drawback with this method is that it is difficult to etch the substrate without etching the epitaxial layer (even when the epitaxial layer is held at an electric potential). This undesirable etching of the epitaxial layer may reduce the accuracy of the transducer.

Another drawback with many existing force detection devices, such as accelerometers, is that they often have an asymmetrical design, which may make it more difficult to incorporate the accelerometer into a system, particularly in high performance applications. For example, the proof mass flexure hinge is typically etched on the opposite surface of the substrate as the transducers. This produces an asymmetrical device in which the input axis of the accelerometer is skewed relative to a direction normal to the surface of the silicon wafer.

Pendulous accelerometers, for example, vibrating beam accelerometers, capacitive accelerometers, capacitive rebalance accelerometers, and translational mass accelerometers comprise a reaction mass. Existing design and manufacturing techniques for these devices are described in U.S. Pat. Nos. 4,495,815 "Mass And Coil Arrangement For Use In An Accelerometer," 5,396,798 "Mechanical Resonance, Silicon Accelerometer," 4,766,768 "Accelerometer With Isolator For Common Mode Inputs," 5,228,341 "Capacitive Acceleration Detector Having Reduced Mass Portion," 5,350,189 "Capacitance Type Accelerometer For Air Bag System," 4,335,611 "Accelerometer," and 3,702,073 "Accelerometer" which are incorporated herein by reference. All practical pendulous accelerometers to date function on the principle of Neuton's law that force equals mass times acceleration. In many accelerometer applications high performance and small size are desirable. One problem with the design of small, high performance pendulous accelerometer sensors involves obtaining adequate reaction mass in a small space. A second problem with the design of small, high performance pendulous accelerometer sensors involves providing adequate isolation from the mounting structure such that mounting strains do not affect accelerometer performance. Typical accelerometer sensors include a pendulous reaction mass, often referred to as a proof mass, suspended from a stationary frame by, for example, a flexural suspension member of some other form of pivot mechanism. This pivot constrains the reaction mass to only one direction of motion; the reaction mass is free to move along this one direction of motion unless restrained to the null position. The pendulous reaction mass must be restrained under acceleration by an opposing force which may be the result of a position feedback circuit. Alternatively, the accelerometer may be an open-loop device in which the opposing force may be supplied a spring in the form of, for example, pivot stiffness. In a typical accelerometer sensor mechanism the pendulous reaction mass is suspended on a flexural suspension member inside an external support frame. Isolation is typically provided by mounting the supporting frame itself inside an isolation feature supported from a final exterior frame which provides mounting both to sensor covers and to the accelerometer housing. The above features as practiced in a typical vibrating beam accelerometer sensor are shown in FIGS. 1 and 2. The large exterior frame system is static and adds no mass to the active reaction mass. Additionally, any external strain couples through the exterior frame system directly across the length of the sensor mechanism. The resulting large frame dimensions tend to maximize the effect of error drivers, for example, thermal expansion mismatch, placing additional burden on the isolator function.

SUMMARY OF THE INVENTION

The present invention provides methods for detecting and measuring forces with mechanical resonators and improved methods of manufacturing these force detecting apparatus. These methods and apparatus are useful in a variety of applications, and they are particularly useful for measuring acceleration.

The present invention includes a substrate coupled to a thin active layer each comprising a semiconducting material. The substrate has a frame and a proof mass suspended from the frame by one or more flexures. The active layer includes one or more vibratory force transducers suitably coupled to the proof mass for detecting a force applied to the proof mass. According to the present invention, an insulating layer is formed between the substrate and the active layer to insulate the active layer from the substrate. Providing a separate insulating layer between the substrate and active layer improves the electrical insulation between the proof mass and the transducers, which allows for effective transducer operation over a wide range of temperatures.

In a specific configuration, the substrate and active layer are made from a silicon material, ane the insulating layer comprises a thin layer (e.g., about 0.1 to 10.0 macrometers) of oxide, such as silicon oxide. The silicon oxide layer retains its insulating properties over a wide temperature range to ensure effective transducer performance at, for example, high operating temperatures on the order of above about 70° C. to 100° C. In addition, the insulating layer inhibits undesirable etching of the active layer while the substrate is being etched, which improves the accuracy of the apparatus.

In a preferred configuration, the flexure hinge of the proof mass is preferably etched near or at the center of the silicon substrate that comprises the proof mass (i.e., substantially centered between the first and second surfaces of the substrate). This arrangement provides an input axis that is substantially normal to the surface of the substrate, thereby improving the alignment.

In an exemplary embodiment, the force detecting apparatus comprises an accelerometer for measuring the acceleration of the stationary frame relative to the proof mass. In this embodiment, the active layer includes a pair of vibratory force transducers on either side of the proof mass. The vibratory force transducers each preferably include first and second parallel beams each having a first end portion fixed to the proof mass, a second end portion fixed to the instrument frame and a resonating portion therebetween. The transducers each further include first and second electrodes positioned adjacent to and laterally spaced from the first and second beams. An oscillating circuit is capacitively coupled to the electrodes for electrostatically vibrating the beams and for determining a magnitude of a force applied to the proof mass based on the vibration frequency of the beams.

The accelerometer of the present invention is manufactured by applying an insulating layer of silicon oxide between the silicon substrate and the active layer. Preferably, the silicon oxide layer is first deposited or grown onto substantially planar surfaces of the substrate and the active layer, and then the substrate and active layer are bonded together, e.g., with high temperatures, so that the silicon oxide layers insulate the substrate from the active layer. In a preferred configuration, portions of the silicon wafers will be removed after they have been bonded together to provide a substrate of about 300 to 700 micrometers and a relatively thin active layer of about 5 to 40 micrometers bonded thereto. The proof mass and instrument frame are then etched into the substrate and the transducers are etched, preferably with reactive ion etching, into the active layer. The insulating layer inhibits undesirable etching of the active layer while the substrate is being etched and vice versa. Forming the accelerometer components from the silicon wafers results in the transducer beams being mechanically coupled to the proof mass and the frame. Both the beams and the electrodes are then coupled to a suitable external oscillator circuit.

Additionally, the present invention resolves significant problems of the prior art by providing both superior mounting stress isolation and substantially reduced acceleration sensor mechanism size while maintaining adequate mass in the reaction mass without increasing manufacturing costs. In the present invention the external frame isolation system is eliminated and the remaining structure becomes the active reaction mass. The present invention describes various embodiments optimized for various g-range applications. The illustrated embodiments substantially reduce mechanism size and maximize active mass while maximizing isolation from external error sources and minimizing heat flow.

Other features and advantages of the invention will appear from the following description in which the preferred embodiment has been set forth in detail in conjunction with the accompanying drawings.

DESCRIPTION OF THE SPECIFIC EMBODIMENTS

Figure 1:
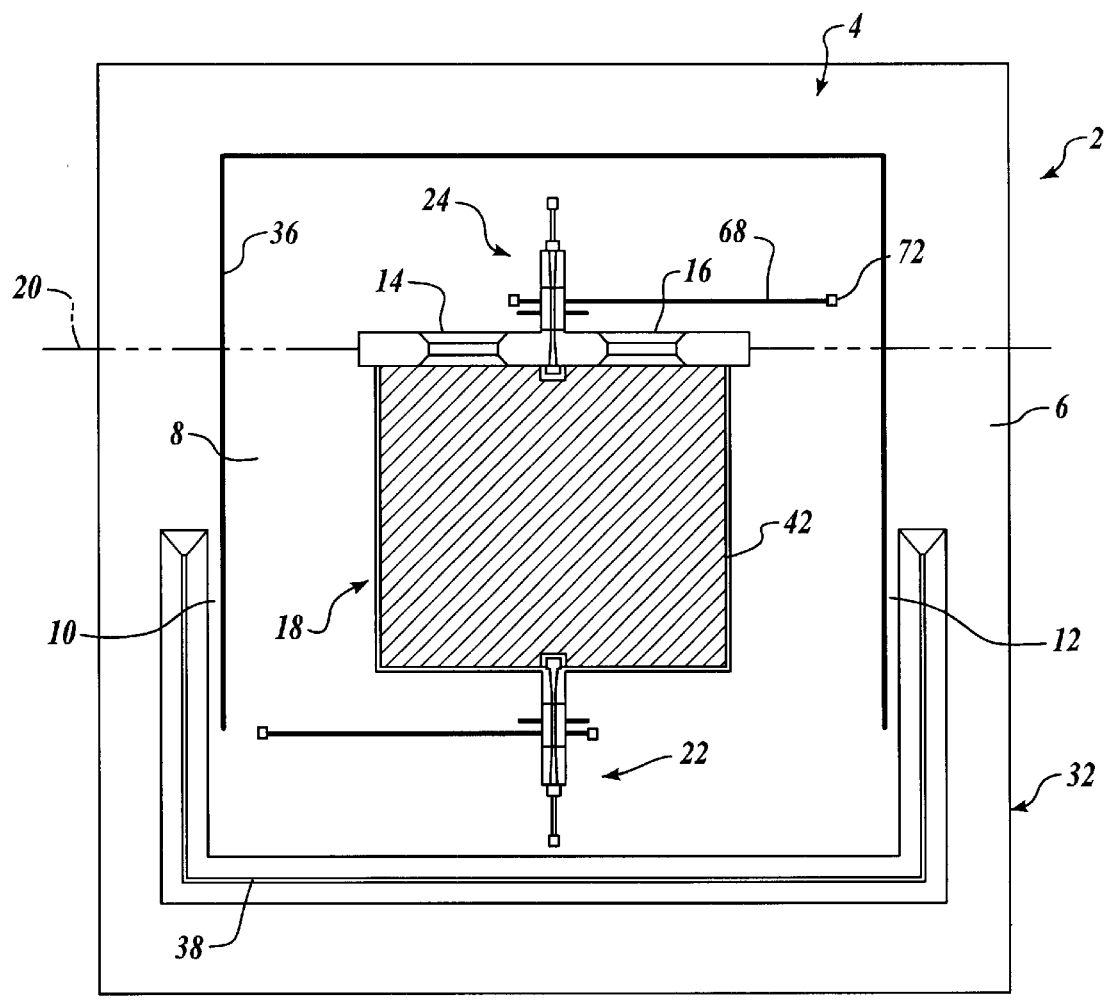
FIG. 1 is a schematic top view of a micro silicon accelerometer manufactured according to the principles of the present invention.

Referring to the figures, wherein like numerals indicate like elements, a representative force detecting system or accelerometer 2 is illustrated according to the present invention. Accelerometer 2 is a miniature structure fabricated from a body of semiconductor material by micro-machining techniques. As shown in FIG. 1, accelerometer 2 is preferably formed from a monocrystalline silicon body 4 that includes a pair of inner flexures 14, 16 supporting a proof mass 18 for movement of the proof mass 18 about a hinge axis 20 parallel to the plane of body 4. Proof mass 18 will move about hinge axis 20 in response to an applied force, such as the acceleration of the vehicle, aircraft or the like that houses accelerometer 2. Accelerometer 2 includes a pair of vibratory force transducers 22, 24 coupled to proof mass 18 and to body 4 for measuring forces applied to proof mass 18 (discussed in detail below). An oscillator circuit 30 (FIG. 6) electrostatically drives transducers 22, 24 at their resonance frequency. When a force is applied to proof mass 18, mass 18 will rotate about hinge axis 20, causing axial forces (compressive or tensile) to be applied to transducers 22, 24. The axial forces change the frequency of vibration of transducers 22, 24 and the magnitude of this change serves as a measure of the applied force.

Figure 2:
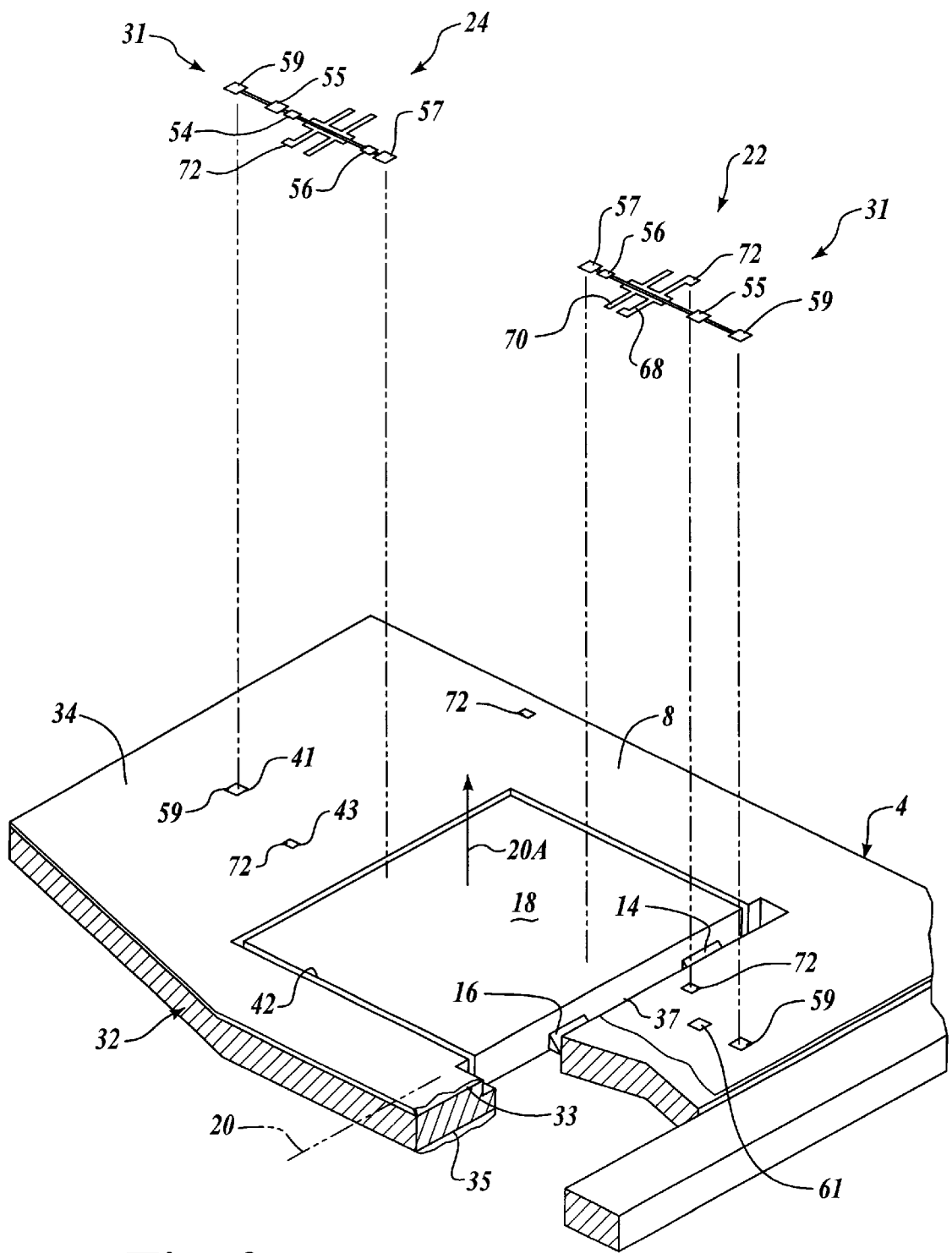
FIG. 2 is an exploded view of the accelerometer of FIG. 1.
Figure 7A:
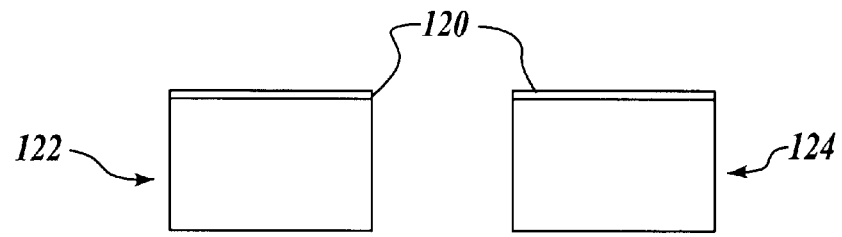
FIGS. 7A–7C are schematic views illustrating a method for manufacturing an accelerometer according to the present invention.
Figure 7B:
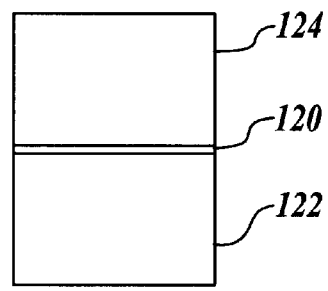
Figure 7C:
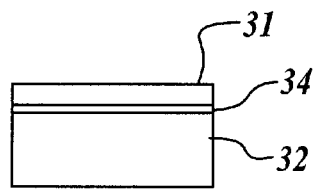

FIG. 2 schematically illustrates silicon body 4 comprising an upper silicon or active layer 31 electrically isolated from an underlying substrate 32 by an insulating layer 34 applied to substrate 32 (note that an insulating layer may also be applied to active layer 31, as shown in FIGS. 7A–7C). Insulating layer 34 preferably comprises a thin layer (e.g., about 0.1 to 10.0 micrometers) of oxide, such as silicon oxide. The silicon body 4 is usually formed by oxidizing active layer 31 and substrate 32, and then adhering the two layers together. A portion of active layer 31 will be removed to bring layer 31 to the desired thickness The silicon oxide layer 34 retains its insulating properties over a wide temperature range to ensure effective transducer performance at, for example, high operating temperatures on the order of above about 70° C. to 100 C. In addition, the insulating layer 34 inhibits undesirable etching of the active layer while the substrate is being etched (as discussed in detail below).

As shown in FIG. 2, proof mass 18 is formed from substrate 32 by etching a slot 42 through substrate and suitably etching around inner flexures 14, 16. Transducer 22 and the appropriate electrical bonds 59, 72 (discussed below) for coupling transducer 22 to oscillator circuit 30 are formed on active layer 31 by suitable etching techniques, such as reactive ion etching, anisotropic etching or the like. Preferably, electrical bonds 59, 72 are directly coupled to oscillator circuit 30. If desired, the remaining portions (not shown) of active layer 31 may then be removed to minimize disturbances to the active components.

As shown in FIG. 2, inner flexures 14, 16 are preferably etched near or at the center of the silicon substrate 32 (i.e., substantially centered between upper and lower surfaces 33, 35). Preferably, flexures 14, 16 are formed by anistropically etching the flexures in a suitable etchant, such as potassium hydroxide. This arrangement provides an input axis 20A that is substantially normal to the plane of substrate 32, which reduces the skew of the input axis 20A relative to the mass of the proof mass 18. Flexures 14, 16 are preferably spaced from each other and define an effective hinge point 37 centered therebetween. Alternatively, a single flexure (not shown) may be formed at hinge point 37. Preferably, flexures 14, 16 are designed to limit S-bending. To this end, flexures 14, 16 will preferably have a relatively short length.

Referring again to FIG. 1, outer and inner frames 6, 8 are formed on substrate 32 by etching slots 36, 38 through substrate 32. Slots 36, 38 overlap each other to form flexures 10, 12 so that inner and outer frames 6, 8 are movable relative to each other. Outer frame 6 is usually coupled to a silicon cover plate (not shown), which, in turn, is typically connected to a ceramic or metal mounting plate (not shown). Since the mounting and cover plates are fabricated from different materials, they will usually have substantially different coefficients of thermal expansion when heated. This thermal mismatching may cause undesirable stresses and strains at the interface of the inner and cover plates, causing a slight distortion of outer frame 6. Flexures 10, 12 allow inner frame 8 to move relative to outer frame 6 to minimize the distortion of inner frame 8 and thereby decrease the effects of thermal mismatching on transducers 22, 24.

Figure 3:
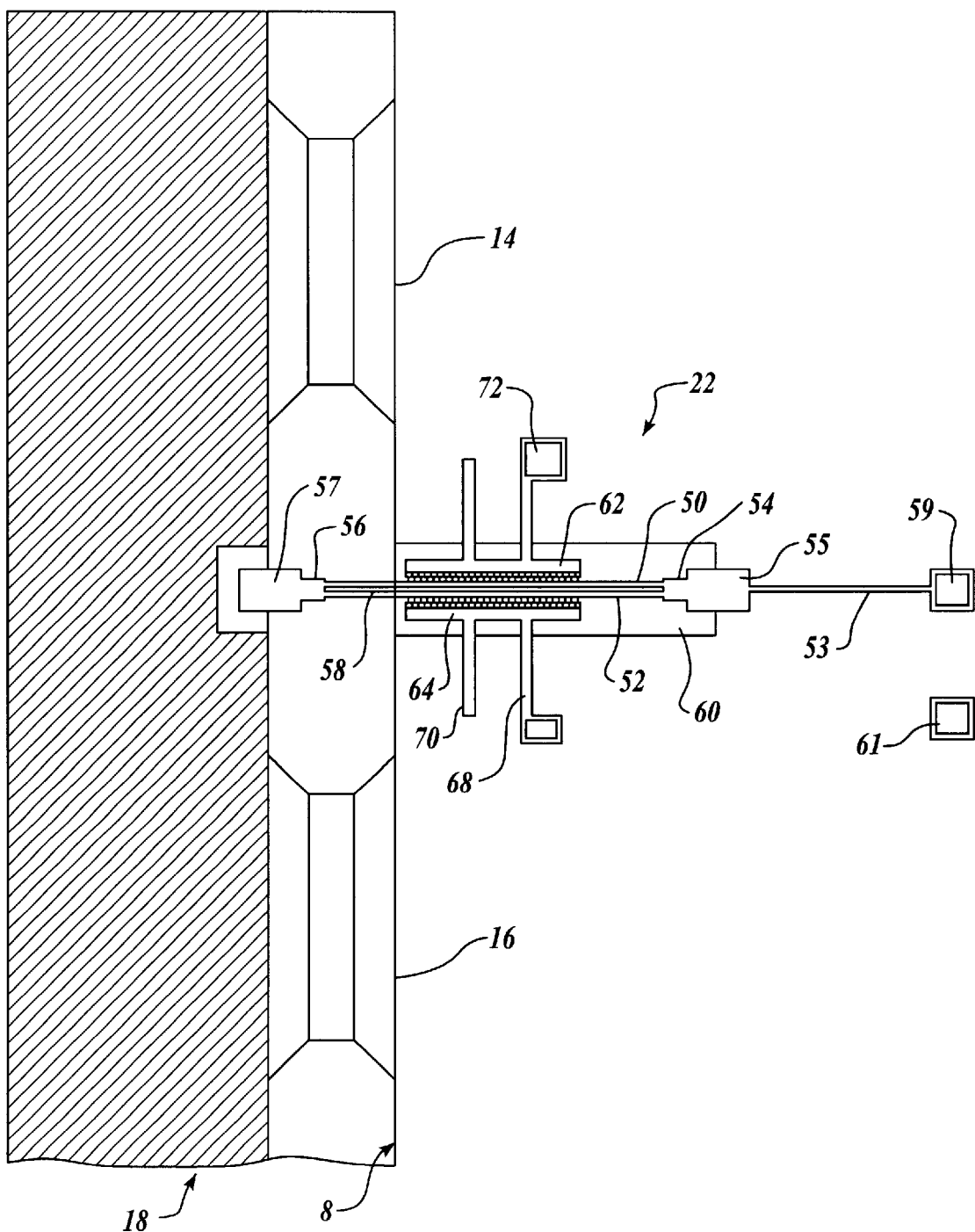
FIG. 3 is an enlarged view of a portion of the accelerometer of FIG. 1, illustrating an exemplary vibratory force transducer.
Figure 4:
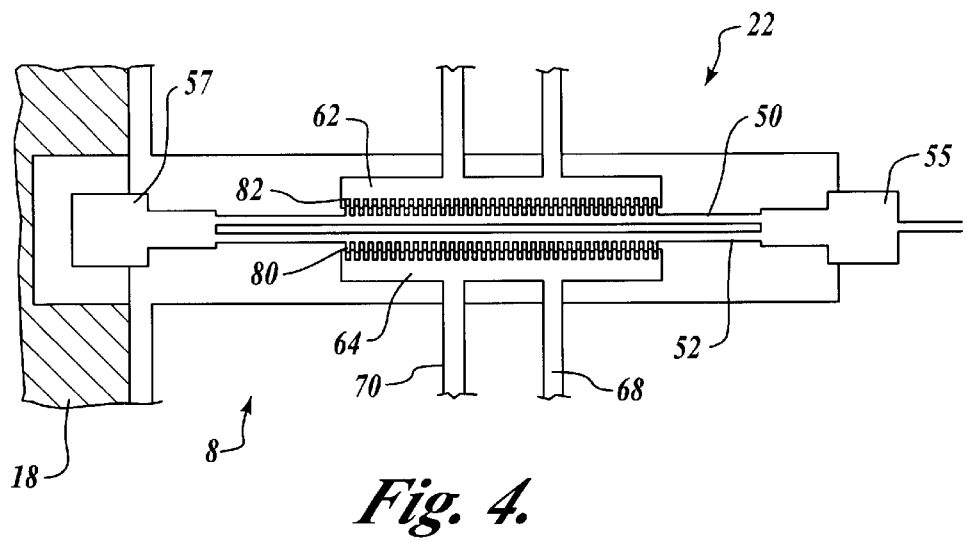
FIG. 4 is an enlarged view of the vibratory force transducer of FIG. 3.
Figure 5:
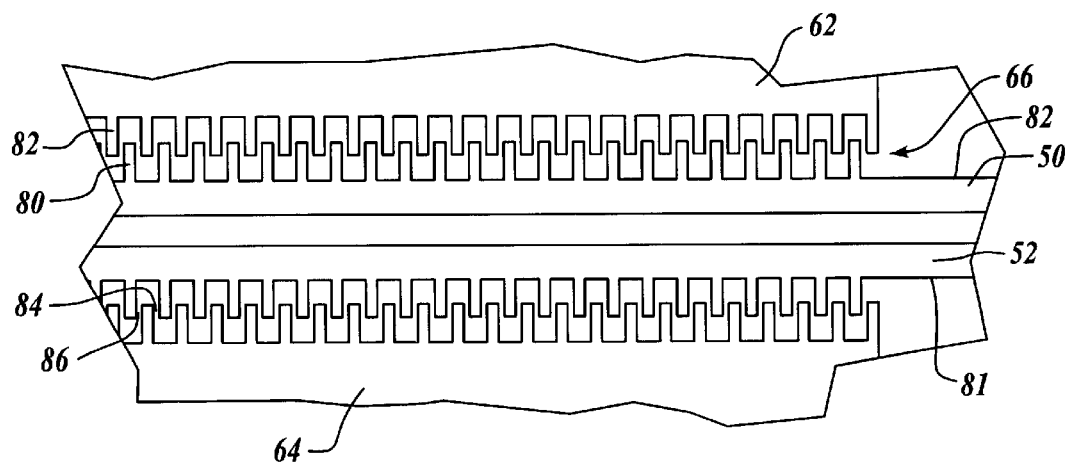
FIG. 5 is a further enlarged view of the vibratory force transducer, illustrating the intermeshed projecting fingers of the present invention.

Referring to FIGS. 3–5, one of the vibratory transducers 22 will now be described in detail. Vibratory transducer 22 comprises a pair of generally parallel beams 50, 52 coupled together at enlarged or widened end portions 54, 56 and separated from each other by a slot 58 to form a double ended tuning fork. Beams 50, 52 are formed from active silicon layer 31 and separated from substrate 32 so that the beams may be vibrated laterally relative to fixed end portions 54, 56 (discussed below). End portions 54, 56 are suitably bonded to proof mass 18 and body 4, respectively, by mounting pads 55, 57. Widened end portions 54, 56 are provided to mechanically couple the vibrating beams 50, 52 to each other. Slot 58 will usually have a width of about 10 to 30 microns and a length of about 1000 to 2000 microns. However, it will be understood that these dimensions may vary depending on the design.

Of course, it should be recognized that the present invention is not limited to the double ended tuning fork described above and shown in FIGS. 3–5. For example, accelerometer 2 may incorporate a single beam or a variety of other mechanical resonator arrangements. However, a double ended tuning fork arrangement is generally preferred because beams 50, 52 can be driven laterally in opposite directions relative to each other. Driving beams 50, 52 in opposite directions minimizes the transfer of energy from the moving beams to the rest of the components in accelerometer 2, which increases the effectiveness of the transducer.

Transducers 22, 24 each further include an electrostatic drive for laterally vibrating beams 50, 52 at the resonance frequency. The electrostatic drive includes a pair of elongate electrodes 62, 64 located on either side of beams 50, 52, respectively. Electrodes 62, 64 are generally parallel to and laterally spaced from beams 50, 52 by a gap 66 (see FIG. 5). Electrodes 62, 64 are etched from active layer 31 and doped with a suitable conductive material to create the necessary charge carriers and to facilitate completion of the electrical circuit. Alternatively, electrodes 62, 64 may be formed from an electrically conductive material, such as gold, that is bonded to active layer 31.

As shown in FIGS. 1 and 3, each electrode 62, 64 is supported by a pair of support arms 68, 70 extending laterally away from beams. One of the support arms 68 on each electrode 62, 64 is coupled to a bonding pad 72 for electrically coupling electrodes 62, 64 to oscillation circuit 30 (see FIG. 5). Mounting pad 57 is coupled to an arm 53 that electrically couples beams 50, 52 to a bonding pad 59. Bonding pad 59 is suitably coupled to oscillation circuit 30 to complete the electrical circuit with electrodes 62, 64 and beams 50, 52. As shown in FIG. 2, substrate 32 may also include a bonding pad 61 for electrically connecting substrate 32 to ground. Bonding pads 59, 61 and 72 are formed from a suitable conductive material, such as gold.

FIGS. 4 and 5 illustrate a preferred embodiment of the present invention, in which beams 50, 52 each include a plurality of fingers 80, 86 projecting outward from a lateral surface 82, 84 of each beam 50, 52 toward the corresponding electrode 62, 64. Likewise, electrodes 62, 64 each include a plurality of fingers 82, 84 projecting laterally inward so that beam fingers 80, 86 and electrode fingers 82, 84 are intermeshed with each other. Fingers 80, 82 are each sized so that their ends 84 will not contact beams 50, 52 or electrodes 62, 64 when beams 50, 52 are laterally vibrated relative to electrodes 62, 64. Usually, fingers 80, 82 will have a length of about 20 to 60 microns and preferably about 35 to 45 microns so that fingers 80, 82 overlap each other in the lateral direction by about 2–10 microns. Electrode fingers 82 and beam fingers 80 are axially spaced from each other by a suitable distance to provide electric capacitance therebetween. Usually, electrode and beam fingers 82, 80 will be spaced by about 2 to 10 microns from each other and preferably about 4 to 8 microns. Since beam fingers 80 are axially spaced from electrode fingers 82, the distance between these fingers will generally remain constant as beams 50, 52 vibrate in the lateral direction.

Electrostatic force is generally proportional to the square of the charge, which is proportional to the voltage and to the capacitance between the beam and the electrode. The capacitance is inversely proportional to the distance between the beam and the electrode. Accordingly, the electrostatic force is proportional to the square of the voltage and inversely proportional to the square of the distance between the beam and the electrode. Thus, changes in the distance between the beam and the electrode will typically change the electrostatic force. In fact, this change in the electrostatic force often acts as an electrical spring that works opposite to the elastic force or mechanical spring of the beams to lower the resonance frequency. For example, as the beam moves from its rest position closer to the electrode, the electrostatic force increases, the change in force working opposite to the elastic force of the beam. When the beam moves from its rest position away from the electrode, the electrostatic force decreases, so that the change in electrostatic force again works against the elastic restoring force of the beam. This lowers the resonance frequency of the beam by a factor related to the magnitude of the bias voltage. Accordingly, the resonant frequency of the beams is generally sensitive to changes in the bias voltage.

In the present invention, the distance between intermeshed beam and electrode fingers 80, 82 remains substantially constant as the beams 50, 52 vibrate relative to the stationary electrodes 62, 64. The electrostatic force between the beams and the electrodes is generally proportional to the change in capacitance with distance. Since the capacitance between the intermeshed electrode and beam fingers changes linearly with the motion of the beams, the electrostatic force will remain substantially constant as the beams move toward and away from the electrodes. Accordingly, the electrostatic force will remain substantially constant during vibration of beams 50, 52 and, therefore, will not work against the mechanical spring of the beams 50, 52 to lower the resonance frequency. Thus, the sensitivity to changes in bias voltage is decreased with the present invention. Applicant has found that this sensitivity is reduced by 5 to 10 times compared to a similar resonator that does not incorporate intermeshed fingers. Reducing the sensitivity of the resonance frequency to changes in bias voltage increases the accuracy of the vibratory force transducer. In addition, this allows the transducer to effectively operate with higher bias voltage levels, which results in a larger signal-to-noise ratio and requires less amplifier gain in the oscillator circuit. Usually, a bias voltage of about 5 to 100 Volts will be applied to electrodes 62, 64 and beams 50, 52 and preferably at least 50 Volts will be applied to the electrodes and beams.

Figure 6:
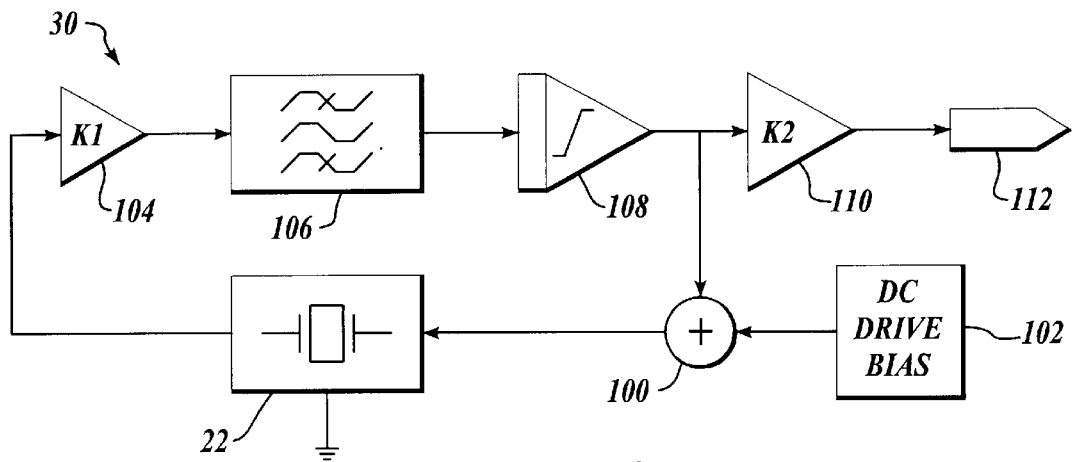
FIG. 6 is a block diagram of an electrical circuit for driving the transducer of FIG. 3.

FIG. 6 illustrates a representative oscillation circuit 30 in which vibrating beams 50, 52 of transducers 22, 24 function as a resonator. A transimpedance amplifier 104 converts a sense current received from vibrating beams 50, 52 to a voltage. This voltage is filtered by a bandpass filter 106, which reduces noise, and its amplitude is controlled by an amplitude limiter 108. The resulting signal is combined with the output or DC bias voltage from a DC source 102 in a summing junction 100. The DC bias voltage generates a force between electrodes 62, 64 and beam 50, 52. The signal from amplitude limiter 108 modulates this force causing beams 50, 52 to vibrate laterally at their resonant frequency. This lateral beam motion, in turn, generates the sense current. An output buffer 110 isolates the oscillator from external circuitry connected to an output 112 of oscillation circuit 30. The gain in oscillation circuit 30 sustains oscillation of beams 50, 52.

As shown in FIG. 1, forces applied to proof mass 18 will cause proof mass 18 to rotate about hinge axis 20. This rotation generates an axial force against transducers 22, 24. The axial force applied to transducers 22, 24 proportionally changes the vibration frequency of beams 50, 52 in each transducer 22, 24. To minimize changes in the vibration frequency of beams 50, 52 that are not related to the applied force, it is advantageous to have a relatively high velocity from the vibrational motion of beams 50, 52. The vibrational velocity is generally proportional to the resonance amplification factor (Q) and, therefore, it is generally considered beneficial to maximize the Q of vibratory transducers 22, 24. Typically, Q is maximized by partially evacuating accelerometer 2 to reduce damping of beams 50, 52. This is because the air between the moving beams 50, 52 and the electrodes 62, 64 damps the movement of beams 50, 52 toward electrodes 62, 64. On the other hand, it is also desirable to provide gas damping of proof mass 18 to minimize the vibration of proof mass 18 that is not related to an applied force. For example, if a force were applied to mass 18 in a vacuum or near vacuum, the mass 18 would continue to swing back and forth about inner flexures 14, 16 until it eventually slowed to a halt. Undesirable resonance can also be caused by vibrations in the surrounding environment (other than the applied force) that cause the proof mass to oscillate. Gas damping of proof mass 18 minimizes these undesirable oscillations.

Applicant has found that intermeshed beam and electrode fingers 80, 82 decrease the damping of beams 50, 52 at pressures above vacuum on the order of 5 to 10 times. In fact, transducers 22, 24 of the present invention operate effectively in air having substantially higher pressure levels than vacuum (on the order of $1/10$ to 1 atmosphere). Applicant believes that this occurs because a portion of the air between beams 50, 52 and electrodes 62, 64 is located in the axial gaps between beam and electrode fingers 80, 82. Since fingers 80, 82 are not moving toward and away from each other, this portion of the air contributes substantially less to the damping of the beams 50, 52. Accordingly, transducers 22, 24 can be operated at atmospheric pressure, which allows proof mass 18 to be gas damped to minimize undesirable vibrations in the proof mass 18.

Referring to FIGS. 7A–7C, the method of manufacturing accelerometer 2 according to the present invention will now be described. An insulating layer of silicon oxide is first applied to substrate 32, active layer 31 or both. Preferably, an oxide layer 120 is epitaxially grown on substantially flat surfaces of silicon wafers 122, 124, as shown in FIG. 7A. The silicon wafers 122, 124 are then placed together (see FIG. 7B), preferably by molecular bonding at elevated temperatures (e.g., on the order of about 300° C. to 500° C.). In a preferred configuration, portions of the silicon wafers 122, 124 will be removed after they have been bonded together to provide a substrate 32 having a thickness of about 300 to 700 micrometers, preferably about 400 to 600 micrometers, and a relatively thin active layer 31 of about 5 to 40 micrometers, preferably about 10 to 30 micrometers (see FIG. 7C).

Proof mass 18 and instrument frames 6, 8 are then etched into substrate 32 so that proof mass 18 is suspended from inner frame 8 by flexures 14, 16, and transducers 22, 24 are etched into active layer 31 (see FIGS. 1 and 2). Insulating layer 34 inhibits undesirable etching of transducers 22, 24 while the substrate 32 is being etched and vice versa. First and second parallel beams 50, 52 are etched, preferably with reactive ion etching, into the active layer 31. Electrodes 62, 64 are etched from active layer 31 and doped with a suitable conductive material to create the necessary charge carriers and to facilitate completion of the electrical circuit. After the accelerometers components are formed into the silicon wafers 122, 124, the beams 50, 52 are mechanically coupled to proof mass 18 and inner frame 8, and the electrodes 62, 64 are capacitively coupled to oscillator circuit 30.

Although the foregoing invention has been described in detail for purposes of clarity, it will be obvious that certain modifications may be practiced within the scope of the appended claims. For example, although the present invention is particularly useful for electrostatically driven resonators, it may also be used with other drive means, such as piezoelectric drives, electromagnetic drives, thermal drives or the like.

Additional Embodiments

The present invention as shown in FIGS. 8 through 12 and described below resolves significant problems of the prior art by providing both superior mounting stress isolation and substantially reduced acceleration sensor mechanism size while maintaining adequate mass in the reaction mass without increasing manufacturing costs.

An accelerometer sensor may include pendulous reaction mass, often referred to as a proof mass, suspended from a stationary frame by, for example, a flexural suspension member of some other form of pivot mechanism. This pivot constrains the reaction mass to travel along only one axis unless the reaction mass is restrained to the null position.

Figure 8:
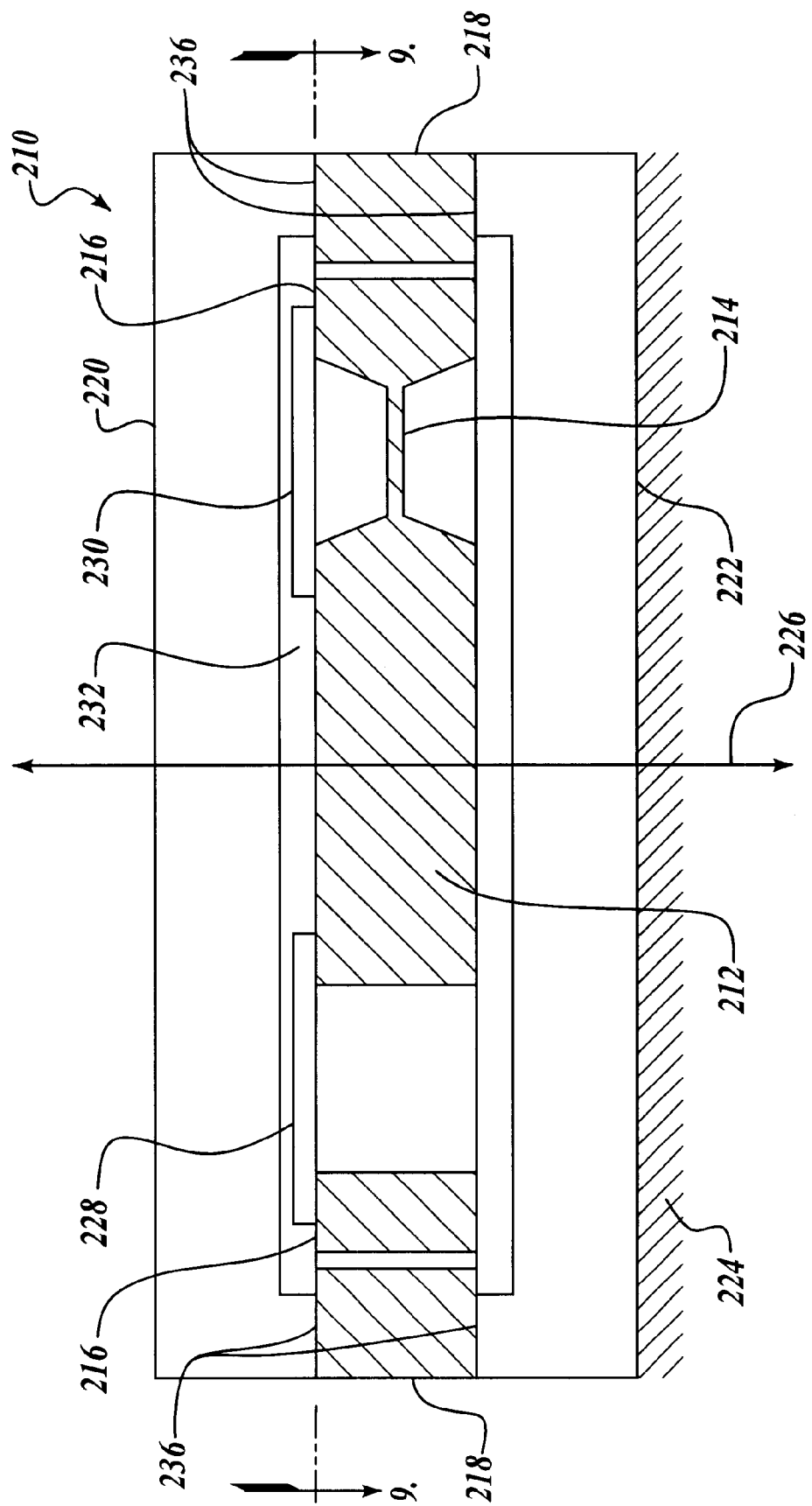
FIG. 8 illustrates one device using vibrating beam technology.
Figure 9:
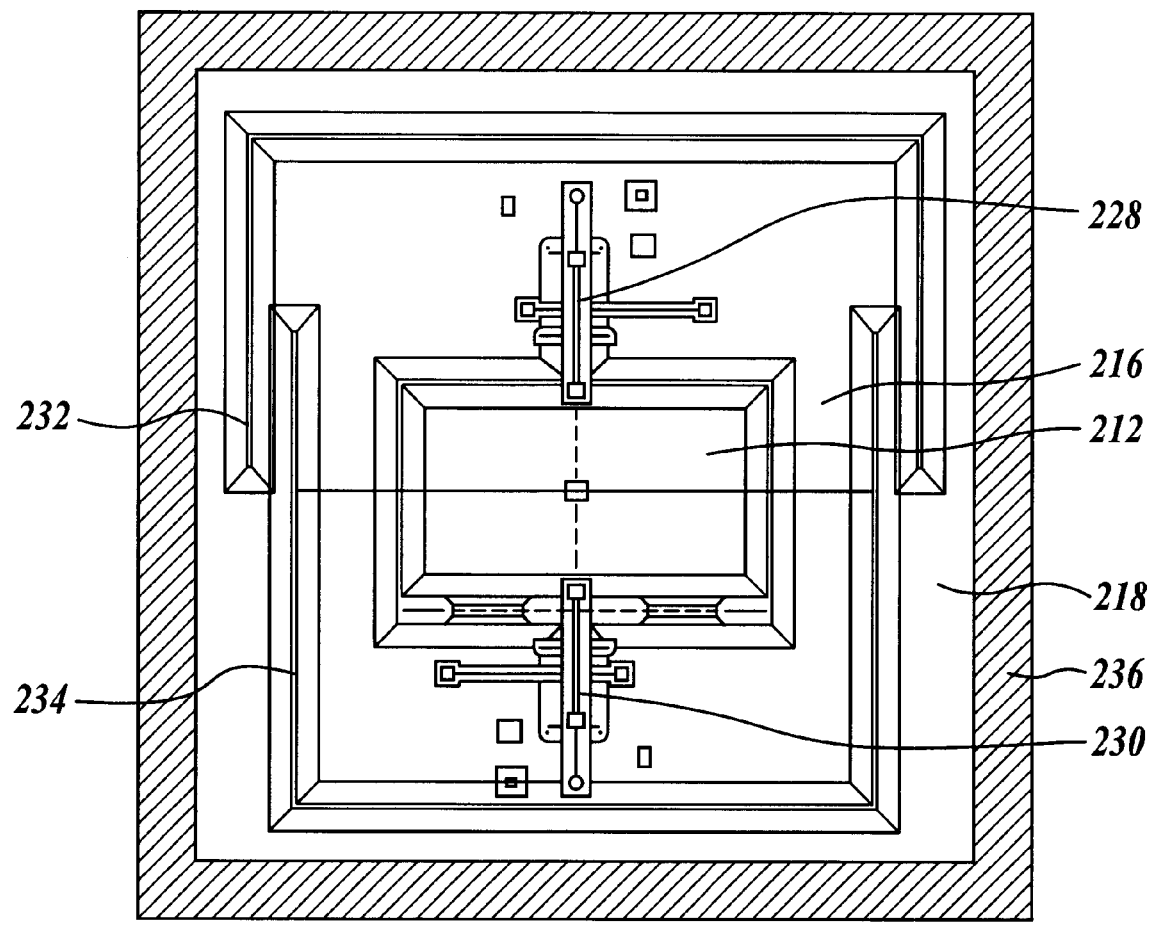
FIG. 9 is a cross-sectional view of the device illustrated in FIG. 8 taken along section line A—A.

FIGS. 8 and 9 illustrate a vibrating beam acceleration sensor mechanism 210 having a pendulous reaction mass 212 suspended on a flexural suspension member 214 inside a first external support frame 216. Support frame 216 itself is typically mounted inside an isolation feature suspended from a final exterior frame 218 that provides mounting both for top cover 220 and bottom cover 222. Sensor 210 is mounted within the accelerometer housing 224, represented by ground, by fixing bottom cover 222 to accelerometer housing 224. Alternatively, the sensor packaging is reconfigured such that sensor 210 is mounted by attaching top cover 220 to accelerometer housing 224. In the typical accelerometer of FIGS. 8 and 9, exterior frame 218 is much larger than reaction mass 212 and larger than external support frame 216. In operation the relatively large exterior frame system comprising support frame 216 and external frame 218 remains static relative to the pendulous reaction mass. Thus, support frame 216 and external frame 218 add no reaction mass to active reaction mass 212.

Reaction mass 212 is free to move relative to support frame 216. However, reaction mass 212 is typically constrained to movement along an input axis 226 aligned substantially perpendicular to the plane of reaction mass 212. Thus, an input force, for example, an acceleration input, applied along input axis 226 displaces reaction mass 212 a distance, x, along input axis 226. Vibrating beam force sensors 228, 230 are mounted to extend between central support frame 216 and reaction mass 212 such that displacement of reaction mass 212 relative to support frame 216 imparts either a compressive or a tensile force to force sensors 228, 230.

External strains experienced by the accelerometer housing may affect acceleration sensor performance. External strains may be caused by, for example, mismatch of thermal expansion coefficients between structural members, physical distortions of housing mounts due to clamping forces, or shocks and vibrations experienced by the housing. In the example illustrated in FIGS. 8 and 9, external strains experienced by accelerometer housing 224 are transmitted to external frame 218 through the structure connecting external frame 218 to accelerometer housing 224, for example, through bottom cover 222. Isolation is provided between vibrating beam force sensors 228, 230 and external strains experienced by external frame 218. The isolation feature may comprise, for example, isolation slots 232, 234. Although vibrating beam force sensors 228, 230 and reaction mass 212 are isolated from external frame 218 by an isolation feature, for example, isolation slots 232, 234, external strain experienced by accelerometer housing 224 may couple through exterior frame 218 and the isolation features directly across the length of sensor mechanism 210. Additionally, the large dimensions of external frame 218 tend to maximize the effect of error drivers, for example, thermal expansion mismatch, placing an additional burden on the isolator function.

Figure 10:
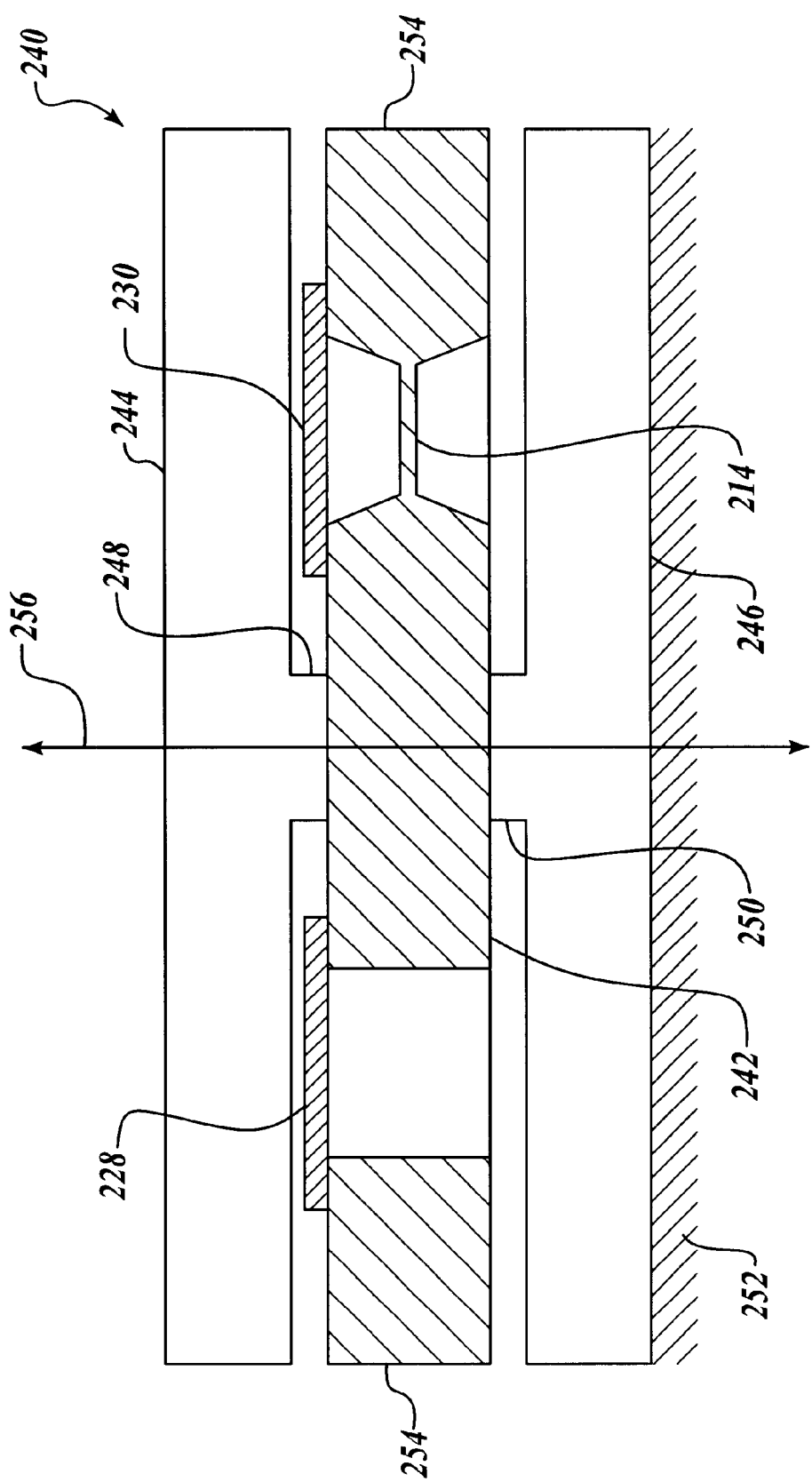
FIG. 10 illustrates an internal mount acceleration sensor mechanism according to one embodiment of the present invention.

One embodiment according to the present invention as practiced in a vibrating beam acceleration sensor is illustrated in FIG. 10 by inverting the typical accelerometer mounting system. The acceleration sensor mechanism 240 of FIG. 10 provides an internal mount/external reaction mass configuration wherein the external frame isolation system is eliminated and the remaining structure becomes the active reaction mass. According to the embodiment illustrated in FIG. 10, reaction mass 212 is replaced by an internal frame member 242 sandwiched between top cover 244 and bottom cover 246 wherein each cover 244, 246 is formed with a central pedestal portion 248, 250, respectively. Central pedestal portions 248, 250 are bonded to opposing surfaces of internal frame member 242 using a suitable bonding method, for example, epoxy bonding. In one embodiment of the present invention, bottom cover 246 is mounted to an accelerometer housing 252 represented by ground. Thus, internal frame member 242 and covers 244, 246 are combined to form a single frame structure fixed to accelerometer housing 252. Alternatively, acceleration sensor 240 is mounted by fixing top cover 244 to accelerometer housing 252. According to the embodiment illustrated in FIG. 10, an external reaction mass 254 is disposed around and external to internal frame member 242 and rotatably suspended therefrom by, for example, a flexural suspension member 214 or another suitable form of pivot mechanism. External reaction mass 254 is formed with an internal passage through its thickness suitable to nest internal frame member 242 rotatably within the passage. Reaction mass 254 and internal frame member 242 may be formed of a single piece of substantially planar substrate material, for example, quartz or silicon, using, for example, laser cutting technology or other manufacturing techniques known to those of skill in the art. Flexural suspension member 214 may also be formed in the single substrate. Reaction mass 254 is constrained, for example, by the hinge mechanism or other means, to movement along an input axis 256 substantially perpendicular to the plane of the substrate. Thus, an input force, for example, an acceleration input, applied along input axis 256 displaces reaction mass 254 a distance, x, along input axis 256. Vibrating beam force sensors 228, 230 are mounted to extend between internal frame member 242 and reaction mass 254 such that displacement of reaction mass 254 relative to internal frame member 242 imparts either a compressive or a tensile force to force sensors 228, 230.

The present invention also results in increased isolation from both external stresses and mounting stresses by providing localized strain coupling instead of multiplying external strain coupling across the length of the mechanism. According to the embodiment illustrated in FIG. 10, the isolation function of external isolation features, for example, isolation slots 232, 234, is obviated. Rather, the isolation function is performed by central pedestals 248, 250. Central pedestals 248, 250 isolate the sensor mechanism from external strains by reducing the interface area to a minimum and by placing the interface point at the center of sensor mechanism 240 such that the moment arm over which any strain-induced force acts is also reduced to a minimum. Thus, stress magnitude is minimized and constrained to a small locality. The stressed locality is nearly ideal because it is centrally located and symmetrical relative to the vibrating beam force sensors.

Strain-induced forces and forces developed at the interface between central pedestals 248, 250 and internal frame member 242 may be further reduced by fixing pedestals 248, 250 to internal frame member 242 using a compliant epoxy bonding technique, for example, the techniques disclosed in U.S. Pat. No. 5,532,665 or U.S. patent application Ser. No. 08/665,036 entitled "Low Stress Magnet Interface" and assigned to the assignee of the present patent application, both of which are incorporated herein by reference, or by conventional epoxy bonding techniques known to those of skill in the art. When the isolation function is thus obviated, the volume previously occupied by central support frame 216 and external frame 218 is available to accommodate a larger active reaction mass without increasing the overall acceleration sensor dimensions.

Additionally, the embodiment of the present invention illustrated in FIG. 10 provides an increased pendulous arm length, the distance from the pivot point of flexural suspension member 214 to the tip of reaction mass 254, by increasing the dimensions of active reaction mass 254 and positioning active reaction mass 254 external to internal frame member 242. Thus, the available mass is used more efficiently.

Alternatively, the present invention according to the embodiment illustrated in FIG. 10 may be scaled down to use a reaction mass 254 which occupies less than the volume formerly occupied by support frame 216 and external frame 218. Thus, an acceleration sensor having an active reaction mass commensurate with that of the configuration illustrated in FIGS. 8 and 9 occupies less volume than if configured according to typical sensor designs. Those of skill in the art will recognize that present invention provides an opportunity to trade volume for pendulousity and vice versa along a continuum ranging from maintaining the original active reaction mass in a reduced volume sensor to increasing the active reaction mass to fill the original volume. Those of skill in the art will further recognize that the degree to which volume is traded for active reaction mass is dependent on many design factors including, for example, available space in which to mount the acceleration sensor, the g-range required by the application, and the materials used in manufacturing the sensor.

The embodiment of the present invention illustrated in FIG. 10 further provides improved thermal response. The heat capacity of suspended reaction mass 254 is lower because the internal mount/external reaction mass configuration provides greater pendulousity using less total pendulous mass. Thus, the raw thermal response time is quicker due to the higher mass efficiency of the reaction mass. Further thermal response aid results from the centrally localized mounting. Because the heat source is centrally localized, heat flow paths are simplified. The heat flow paths are nearly symmetrical and easily controlled by conventional methods which allows more precise thermal ramp matching. According to the embodiment shown in FIG. 10, the heat flow path between the heat source at housing 252 to the detector elements, force sensors 228, 230, begins at the interface between housing 252 and bottom cover 246 and is channeled into internal frame member 242 through pedestal portion 250 which is the single point interface between bottom cover 246 and internal frame member 242. Although external reaction mass 254 may present some secondary effects, the dominant heat flow path between pedestal portion 250 and force sensors 228, 230 is through internal frame member 242. Thus, the heat flow is easily modeled for computer analysis. In contrast, the heat flow path of the prior art embodiment shown in FIGS. 8 and 9 is far more complex and difficult to model. The heat flow path of the prior art embodiment shown in FIGS. 8 and 9 is through bottom cover 222 into exterior frame 218 via peripheral interface 236 (cross-hatched area of exterior frame 218 shown in FIG. 8) between bottom cover 222 and exterior frame 218. The heat flow analysis is further complicated by heat flow from exterior frame 218 into top cover 220 at interface 236. The heat flow path continues into support frame 216 through the isolation feature and through the irregular shape of support frame 216 to force sensors 228, 230. Secondary effects are presented by heat flow through hinge 214 into pendulous reaction mass 212 and through reaction mass 212 into force sensors 228, 230. According to the embodiment of FIG. 10, the improved heat flow paths combined with the reduced heat capacity in the reaction mass produces smaller, more quickly dissipated heat-induced errors when compared with the prior art embodiment shown in FIGS. 1 and 2.

Isolation features may be added around central mounting pedestals 248, 250 to further decouple stress and control heat flow. The isolation features may be, for example, similar to eliminated isolation slots 232, 234 between support frame 216 and external frame isolator 218 or other isolation designs known to those of skill in the art. Additionally, isolation features may be much smaller than disclosed in the prior art and still prove more effective against the lower initial stress levels because the internal mount/external reaction mass configuration decouples stress and controls heat flow. Thus, simple isolation features, for example, isolation slots 232, 234, a "C" shaped slot, a pair of "()" shaped slots or other isolation features known to those of skill in the art will both dissipate stress and direct heat flow. However, isolation features are outside the scope of this invention and are not shown.

Practical accelerometers also generally require a source of reaction mass damping and shock stops for the reaction mass. Typical accelerometer sensors provide shock stops to keep the motion of the reaction mass from over stressing the flexures and, in a vibrating beam accelerometer such as depicted in FIG. 8, from over stressing the vibrating beam force sensors when the reaction mass experiences large acceleration inputs. The shock stops typically comprise physical constraints which limit the motion of the reaction mass along the input axis. The reaction mass shock stop function is often obtained by locating the reaction mass between two stationary cover plates. In the configuration depicted in FIG. 8, top cover 220 and bottom cover 222 provide the shock stops for reaction mass 212. The motion of reaction mass 212 is limited by actual physical contact with either top cover 220 or bottom cover 222.

According to the embodiment of the present invention as illustrated in FIG. 10, shock stops are provided by top and bottom covers 244, 246. The motion of reaction mass 254 is physically limited by the proximity of covers 244, 246. Any displacement, rotational or translational, of reaction mass 254 along input axis 256 is restricted by physical contact with either top cover 244 or bottom cover 246.

Often, viscous gas damping of the reaction mass is desirable and sometimes necessary to avoid the effects of undesirable reaction mass oscillations which may deteriorate sensor performance. Gas damping typically involves locating a pressurized fluid, for example, oil, air or a mixture of inert gases such as nitrogen and helium, in contact with the reaction mass, thereby controlling the effects of an oscillation which would deteriorate the performance of the device. For example, a shock or vibration input force can cause the reaction mass to oscillate back and forth about its rest position after the force has been removed from the reaction mass. Undesirable oscillations can also be caused by vibrations in the surrounding structure. The reaction mass damping function may be obtained by sandwiching the reaction mass between the two stationary cover plates and introducing fluid or gas pressure into the chamber surrounding the reaction mass. Typically, the gas pressure is substantially above vacuum pressure, for example, on the order of about one atmosphere. In a gas-filled mechanism, the closely spaced cover plates constrain the gas such that squeeze film effects provide damping of the reaction mass along the input axis. In a traditional configuration the cover plates are bonded directly to the mechanism frame for accurate control of the shock and damping gap spacing. In the example of FIGS. 8 and 9, cover plates 220, 222 are bonded to the cross-hatched area of external frame 218 at bond lines 236. Pressurized gas is introduced into sensor mechanism 210 and trapped in the chamber surrounding reaction mass 212. Thus, as reaction mass 212 attempts a motion toward top cover 220 during oscillation, the pressurized gas trapped between reaction mass 212 and top cover 220 is squeezed, and when reaction mass 212 attempts a motion toward bottom cover 222, the trapped pressurized gas is squeezed between reaction mass 212 and bottom cover 222. Thus, oscillations of reaction mass 212 are damped by the resistance of the pressurized gas to being further compressed or squeezed.

The traditional configuration, for example, the configuration of FIGS. 8 and 9, locates most of the mechanism mass statically relative to the accelerometer housing such that it contributes no mass to the active reaction mass. As accelerometer size is reduced or scaled down, the active or useful mass of the reaction mass is reduced. Therefore the force available to be sensed for a given acceleration is reduced in proportion to the reduction in reaction mass. As the available force shrinks, the significance of the noise level for any given sensing mechanism increases, limiting the resolution and accuracy of the accelerometer. In other words, the signal-to-noise ratio decreases with decreasing reaction mass and accelerometer resolution and accuracy are reduced proportionally. Thus, size reduction through scaling is limited by the necessity of maintaining a minimum significant amount of active reaction mass. While the embodiment of the invention shown in FIG. 10 provides greater reaction mass efficiency than typical sensor designs and is a preferred embodiment for some applications, other applications, for example, lower g-range applications requiring accurate sensing of accelerations in the micro-g range, may benefit from even greater reaction mass efficiency.

Figure 11:
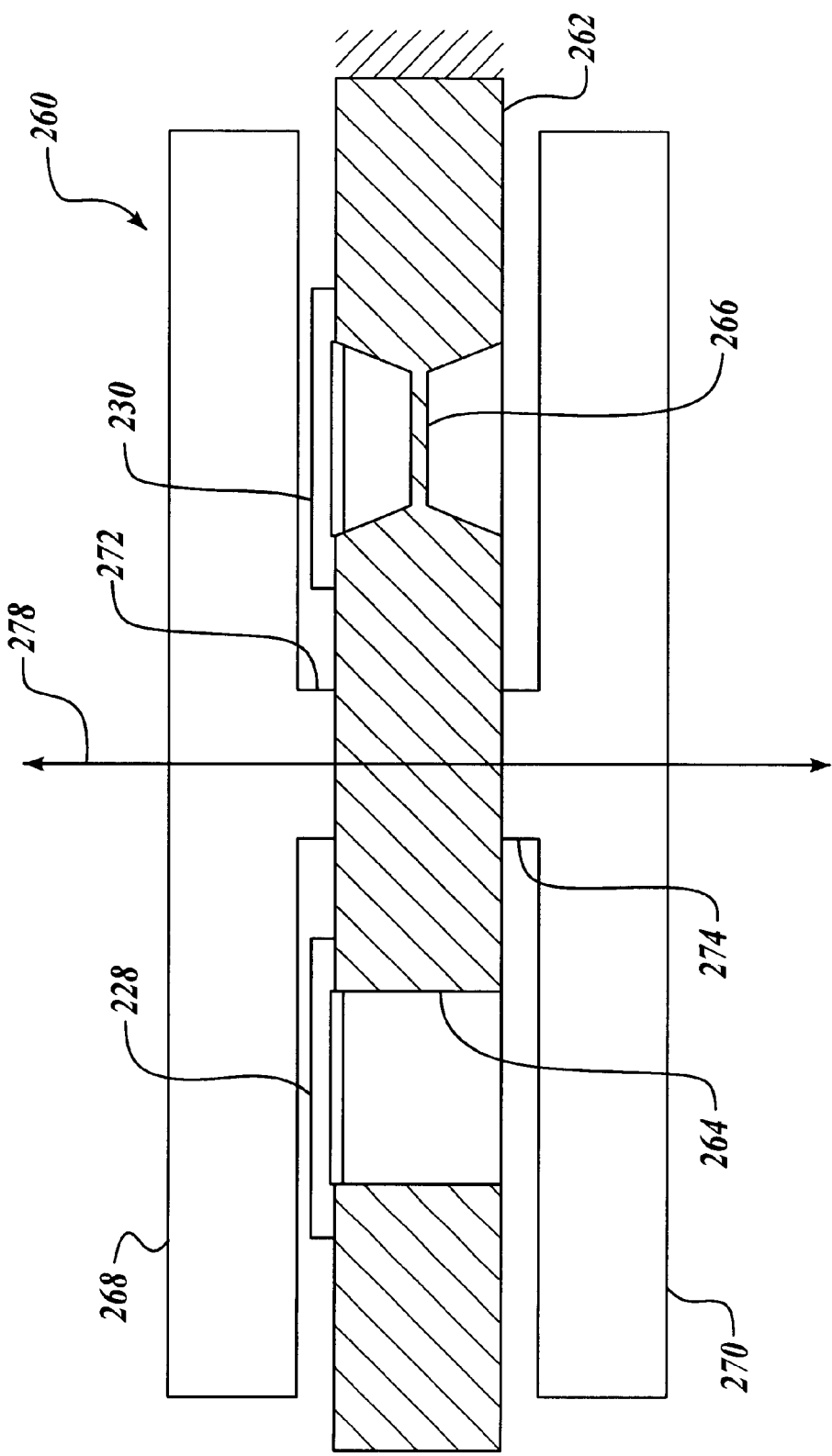
FIG. 11 illustrates an active cover acceleration sensor mechanism according to another embodiment of the present invention.
Figure 12:
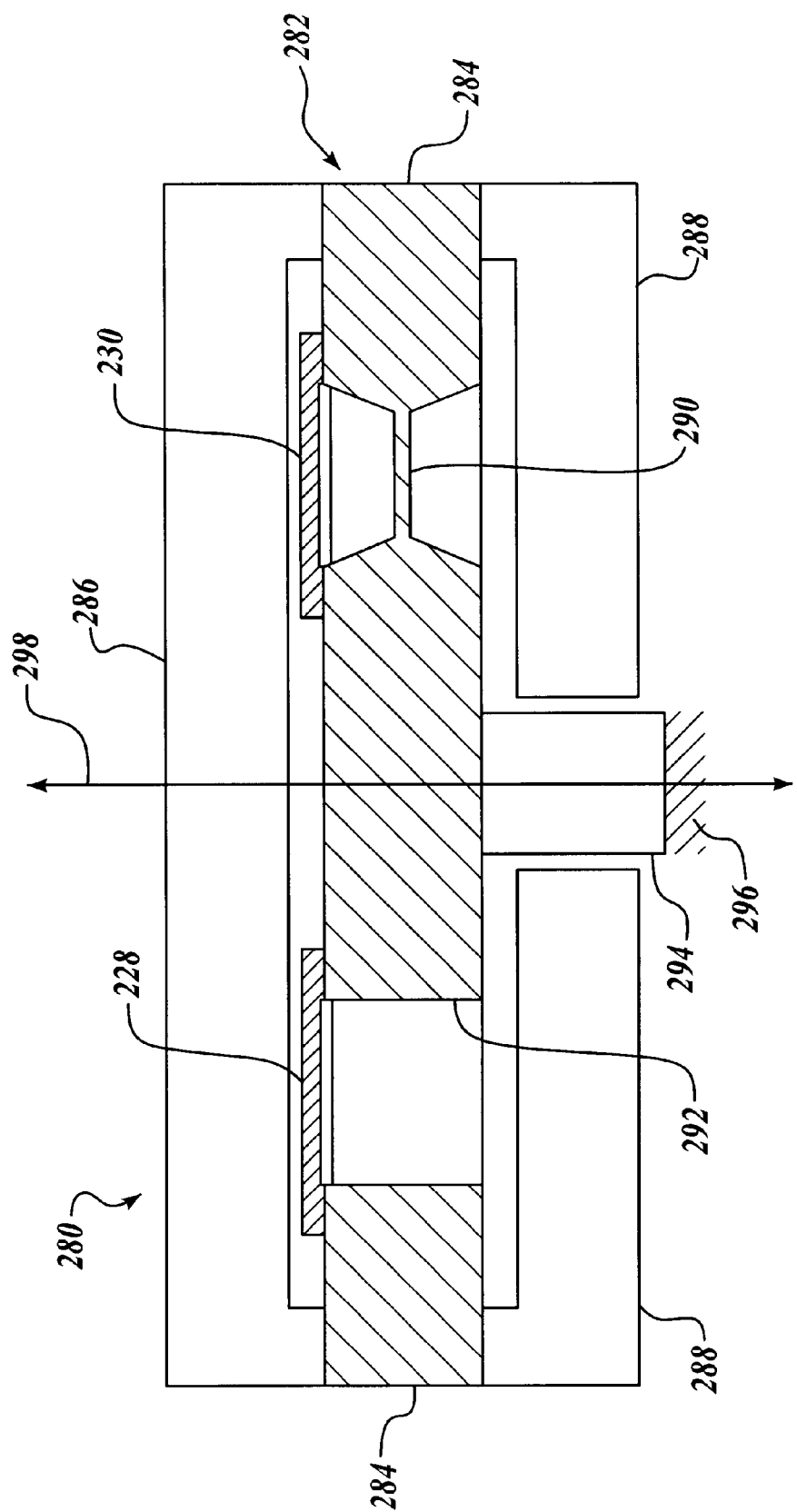
FIG. 12 illustrates an internal mount acceleration sensor mechanism according to yet another embodiment of the present invention.

FIGS. 11 and 12 illustrate two further embodiments of the present invention optimized for low g range applications. For example, an accelerometer using either of the embodiments illustrated in FIGS. 11 and 12 may be used to measure accelerations in the micro-g range. The embodiments illustrated in FIGS. 11 and 12 provide substantially reduced mechanism size and maximum active reaction mass. In other words, the embodiments of FIGS. 11 and 12 provide maximum signal-to-noise ratio in a minimum size mechanism. In contrast to typical sensor designs, in FIG. 11 the arrangement of the reaction mass, frame and covers is altered such that the cover plates are instead bonded to the moving pendulum itself adding their mass to the active reaction mass. The resulting mechanism can be mounted by its frame such that the cover plates now move dynamically with the reaction mass and add their mass into the active reaction mass. In sensor 260, frame 262 is formed with an internal passage through its thickness wherein internal pendulum portion 264 is nested. Internal pendulum portion 264 is suspended by flexure 266 from surrounding frame 262. Some or all of frame 262, internal pendulum 264 and flexural suspension member 266 may be formed of a single substantially planar substrate using manufacturing techniques known to those of skill in the art. The substrate material may be, for example, quartz, silicon or another suitable material. Frame 262 may include an isolation feature, for example, conventional isolation slots which divide frame 262 into an inner support frame and an external mounting frame. Vibrating beam force sensors 228, 230 extend between internal pendulum 264 and frame 262 such that displacement of internal pendulum 264 imparts either a compressive or a tensile force to vibrating beam force sensors 228, 230.

The mechanism of FIG. 11 overcomes the traditional limitations of conventional sensor designs by providing substantially reduced mechanism size and maximum active mass. In FIG. 11, top cover 268 and bottom cover 270 are formed with pedestal portions 272, 274, respectively. Top cover 268 and bottom cover 270 are bonded to opposing surfaces of internal pendulum 264. For example, top and bottom covers 268, 270 may be bonded to internal pendulum 264 at the geometric center of internal pendulum 264, at the center of mass of internal pendulum 264 or at the center of percussion of internal pendulum 264. Thus, top cover 268 and bottom cover 270 add their mass to the active mass of internal pendulum 264 which moves essential reaction mass to internal pendulum 264 and maximizes the active reaction mass without increasing sensor dimensions. The impact of the bonding interface between pedestal portions 272, 274 and internal pendulum 264 is minimized by the inherent symmetry of the design.

Pedestal portions 272, 274 are sized according to known design principles to provide adequate bond area to provide for proper alignment of covers 268, 270 and adequate bond strength in the specific application. Alternatively, pedestal portions 272, 274 may be formed on the opposing surfaces of internal pendulum 264 or may be discrete mechanical components.

Internal pendulum 264 is constrained to travel along an input axis 278 substantially perpendicular to the plane of internal pendulum 264 by, for example, providing flexure 266 with sufficient lateral stiffness to preclude motion in the plane of internal pendulum 264. Shock stop and damping functions are performed in the configuration of FIG. 11 by sandwiching frame 262 between top and bottom covers 268, 270. Thus, travel of internal pendulum 264 along input axis 278 is physically limited by covers 268, 270 contacting frame 262. Squeeze film damping is provided by providing equivalent gaps between stationary mechanism frame 262 and top and bottom covers 268, 270 and introducing a pressurized fluid into the gaps. Sensor 260 is mounted in an accelerometer housing 276, represented by ground, by mounting frame 262 to housing 276 using conventional mounting means, for example, by epoxy bonding.

The embodiment illustrated in FIG. 12 maximizes isolation from external error sources and maximizes active reaction mass while optimizing heat flow. The embodiment illustrated in FIG. 12 reverses the traditional roles of the elements. In this embodiment, the sensor is centrally mounted at the center of the structure which would form the pendulum in a traditional sensor. The covers are connected to the external supporting frame of the reaction mass. Thus, the structure which would traditionally form the pendulum instead forms the fixed mounting structure while the external pendulum portion combines with the covers to form the active reaction mass. This embodiment further provides sealing of the mechanism by fixing the external pendulum member to the covers. The combination of the external pendulum member and the covers provides an increased active reaction mass considerably in excess of the reaction mass of which the reaction mass was previously capable.

Thus, the embodiment of FIG. 12 provides substantially reduced mechanism size and maximum active mass while maximizing isolation from external error sources and optimizing heat flow. In sensor 280, an external reaction mass 282 includes an external pendulum portion 284 fixed to an top cover 286 and a bottom cover 288. External reaction mass 282 is suspended by flexure 290 from internal frame member 292. External pendulum portion 284 is formed with an internal passage through its thickness wherein internal frame member 292 is nested. Some or all of external pendulum 284, internal frame member 292 and flexural suspension member 290 may be formed of a single substantially planar substrate using manufacturing techniques known to those of skill in the art. The substrate material may be, for example, quartz, silicon or another suitable material.

Internal frame member 292 may include an isolation feature, for example, on of the isolation systems described in connection with the embodiment of FIG. 10, above. External reaction mass 282 encloses internal frame member 292 in a chamber comprising a substantially planar external pendulum 284 sandwiched between top cover 286 and bottom cover 288. Top and bottom covers 286, 288 are fixed to opposing sides of external pendulum 284 using, for example, conventional epoxy bonding techniques, thus forming the top, bottom and side walls of a chamber which surrounds and substantially encloses internal frame member 292. For example, top and bottom covers 286, 288 may be bonded to external pendulum 284 of external reaction mass 282 along the periphery of external pendulum 284. Thus, top cover 286 and bottom cover 288 add their mass to the mass of external pendulum 284 which moves essential active reaction mass to external reaction mass 282 and maximizes the reaction mass without increasing sensor dimensions. External reaction mass 282 is constrained to movement along an input axis 298 substantially perpendicular to the plane of external pendulum 284 of external reaction mass 282 by flexure 290. Thus, an input force, for example, an acceleration input, applied along input axis 298 displaces external reaction mass 282 a distance, x, along input axis 298. Vibrating beam force sensors 228, 230 are mounted to extend between internal frame member 292 and external pendulum 284 of external reaction mass 282 such that displacement of external reaction mass 282 imparts either a compressive or a tensile force to vibrating beam force sensors 228, 230.

A central mounting pedestal 294 provides a connection between internal frame member 292 and the accelerometer housing 296, represented by ground. Central pedestal mount 294 is formed with two substantially parallel opposing surfaces. Central pedestal mount 294 passes through a passage formed in bottom cover portion 288 of external reaction mass 282 and one end is fixed to internal frame member 292 by, for example, conventional epoxy bonding techniques known to those of skill in the art. The opposing end of central pedestal mount 294 is fixed to accelerometer housing 296 by appropriate means. Alternatively, central pedestal mount 294 may be formed in an appropriate surface of housing 296. Central pedestal mount 294 is sized according to known design principles to provide adequate bond area to achieve proper alignment of external reaction mass 282 relative to housing 296 and adequate bond strength to support sensor mechanism 280 in the specific application. Thus, the embodiment of the present invention illustrated in FIG. 12 provides an increased pendulous arm length by maximizing the dimensions of active external reaction mass 282 and positioning active external reaction mass 282 external to internal frame member 292. Thus, the available mass is used more efficiently.

The embodiment of FIG. 12 also results in increased isolation from external stresses, including mounting stresses, by providing localized strain coupling instead of multiplying external strain coupling across the length of the mechanism. The isolation function of external isolation features, for example, isolation slots 232, 234 as illustrated in FIG. 9, is obviated. Rather, the isolation function is performed by central pedestal mount 294. Central pedestal mount 294 isolates the sensor mechanism from external strains by reducing the interface area to a minimum and by placing the interface point at the center of sensor mechanism 280 such that the moment arm over which any strain-induced force acts is also reduced to a minimum. Thus, stress magnitude is minimized and constrained to a small locality. The stressed locality is nearly ideal because it is centrally located and symmetrical relative to the vibrating beam force sensors. Strain-induced forces and interface forces may be further reduced by fixing central pedestal mount 294 to internal frame member 292 using compliant epoxy bonding techniques, for example, the techniques discussed in connection with the embodiment of FIG. 10, above. Additionally, central pedestal mount 294 may be formed of the same material used to manufacture internal frame member 292 such that the thermal expansion coefficients of the two structures match exactly and heat distortion of central pedestal mount 294 does not induce thermal strain at the interface with internal frame member 292. Alternatively, central pedestal mount 294 may be formed on an appropriate surface of accelerometer housing 296 or on an appropriate surface of internal frame member 292 whereby protection from thermally-induced strain may be traded against potentially lower manufacturing costs.

The embodiment of the present invention illustrated in FIG. 12 further provides improved thermal response. The heat capacity of suspended external reaction mass 282 is lower than that of typical sensor designs because the internal mount/external reaction mass configuration provides greater pendulousity using less total pendulous mass. Thus, the raw thermal response time is quicker than in conventional sensor designs due to the higher mass efficiency of the reaction mass. Further thermal response aid results from the centrally localized mounting. Because the heat source is centrally localized by central pedestal mount 294, heat flow paths are simplified. The heat flow paths are nearly symmetrical and easily controlled by conventional methods which allows more precise thermal ramp matching. The improved heat flow paths combined with the reduced heat capacity in the reaction mass produces smaller, more quickly dissipated heat flow-induced errors.

Isolation features may be added around the central pedestal mount 294 to further decouple stress and control heat flow. The isolation features may be provided in internal frame member 286 and may be formed, for example, using one of the isolation systems discussed in connection with the embodiment of FIG. 10, above. Any isolation features may be much smaller than disclosed in the prior art and still prove more effective against the lower initial stress levels because the internal mount/external reaction mass configuration decouples stress and controls heat flow. Thus, simple isolation features known to those of skill in the art will dissipate both stress and direct heat flow. However, as noted above, isolation features are outside the scope of this invention and are not shown.

The shock stop and damping functions are performed in the embodiment of the present invention as illustrated in FIG. 12 by sandwiching internal frame member 292 between top and bottom covers 286, 288. Thus, travel of external reaction mass 282 along input axis 298 is physically limited by contact between covers 286, 288 and opposing sides of fixed internal frame member 292. Squeeze film damping is provided by providing equivalent gaps between stationary internal frame member 292 and top and bottom cover portions 286, 288 and introducing a pressurized gas into the gaps.

Alternatively, the present invention according to the embodiment illustrated in FIG. 12 may use an external reaction mass 282 which occupies less than the volume formerly occupied by sensor 10. Thus, an acceleration sensor having an active reaction mass commensurate with that of the configuration illustrated in FIGS. 8 and 9 occupies less volume than if configured according to typical sensor designs. Those of skill in the art will recognize that present invention as embodied in the configuration of FIG. 12 provides an opportunity to trade volume for pendulousity and vice versa along a continuum ranging from maintaining the original active reaction mass in a reduced volume sensor to increasing the active reaction mass to fill the original volume. Those of skill in the art will further recognize that the degree to which volume is traded for active reaction mass is dependent on many design factors including, for example, available space in which to mount the acceleration sensor, the g-range required by the application, and the materials used in manufacturing the sensor.

The present invention resolves the manufacturing cost issues presented by conventional sensor designs by providing the inventive features at essentially no additional manufacturing cost. Neither additional components nor additional processing are required to practice the present invention. The accelerometer topology of the present invention simply reconfigures previously static cover mass to an active condition.

Preferred embodiments of the invention have been described. Those of skill in the art will recognize that many alternative embodiments of the present invention are possible. In many alternative embodiments of the present invention the effective mass center can be placed at a larger radius from the flexures. Thus, the pendulousity increase can be even greater than the active mass increase. Similarly, the effective center of damping can also be moved to a larger radius from the flexures to provide greater damping using a smaller area.

Those of skill in the art will recognize that the present invention can be applied to various types of accelerometers utilizing a reaction mass including, but not limited to, vibrating beam accelerometers, capacitive accelerometers, capacitive rebalance accelerometers, and translational mass accelerometers. For at least these reasons, the invention is to be interpreted in light of the claims and is not limited to the particular embodiments described herein.

What is claimed is:

1. An apparatus for detecting an applied force comprising:
 a housing;
 a substrate comprising a semiconducting material and defining a frame formed with a passage, said frame fixed to said housing;
 a reaction mass defined by said substrate, said reaction mass comprising:
   a) first and second covers, said first cover substantially parallel with and spaced away from said second cover, and
   b) an internal pendulum portion suspended between said first and second covers, said internal pendulum portion positioned within said passage and rotatably suspended from said frame;
 an active layer of semiconducting material comprising one or more vibratory force transducers mechanically coupled to said frame and to said reaction mass for detecting a force applied thereto; and
 an insulating layer formed between said substrate and said active layer to insulate at least a portion of said vibratory transducers from said substrate.

2. The apparatus of claim 1 further comprising first and second pedestal portions, said first pedestal portion extending between a first side of said internal pendulum portion and said first cover and said second pedestal portion extending between a second side of said internal pendulum portion and said second cover.

3. The apparatus of claim 2 wherein said one or more vibratory force transducers comprises first and second vibrating beam force sensors extending between said frame and said reaction mass.

4. An apparatus for detecting an applied force comprising:
a housing;
a frame fixed to said housing, said frame formed of a substantially planar substrate comprising a semiconducting material and formed with a passage;
a reaction mass formed of said substrate, said reaction mass comprising:
   a) first and second substantially planar covers, said first cover substantially parallel with and spaced away from said second cover, and
   b) a substantially planar internal pendulum portion suspended between said first and second covers, said internal pendulum portion nominally positioned within said passage and rotatably attached to said frame;
an active layer of semiconducting material comprising one or more vibratory force transducers mechanically coupled to said frame and to said reaction mass for detecting a force applied thereto; and
an insulating layer formed between said substrate and said active layer to insulate at least a portion of said vibratory transducers from said substrate.

5. The apparatus of claim 4 wherein said one or more vibratory force transducers comprises first and second vibrating beam force sensors extending between said frame and said internal pendulum portion.

* * * * *